United States Patent [19]
Spring et al.

[11] Patent Number: 5,831,318
[45] Date of Patent: *Nov. 3, 1998

[54] RADHARD MOSFET WITH THICK GATE OXIDE AND DEEP CHANNEL REGION

[75] Inventors: Kyle A. Spring, Hawthorne, Calif.;
Perry Merrill, Globe, Ariz.

[73] Assignee: International Rectifier Corporation, El Segundo, Calif.

[*] Notice: The term of this patent shall not extend beyond the expiration date of Pat. No. 5,475,252.

[21] Appl. No.: 687,224

[22] Filed: Jul. 25, 1996

[51] Int. Cl.$^6$ .......................... H01L 21/26; H01L 29/205
[52] U.S. Cl. .......................... 257/402; 257/66; 257/401; 257/409; 257/285; 257/286
[58] Field of Search .............................. 257/66, 335–343, 257/402, 407, 409, 220, 285, 286

[56] References Cited

U.S. PATENT DOCUMENTS

| | | |
|---|---|---|
| 3,799,813 | 3/1974 | Danchenko . |
| 4,295,264 | 10/1981 | Rogers . |
| 4,327,475 | 5/1982 | Asai et al. . |
| 4,364,073 | 12/1982 | Becke et al. . |
| 4,495,513 | 1/1985 | Descamps . |
| 4,502,069 | 2/1985 | Schuh . |
| 4,593,302 | 6/1986 | Lidow et al. . |
| 4,597,824 | 7/1986 | Shinada et al. . |
| 4,599,118 | 7/1986 | Han et al. . |
| 4,672,407 | 6/1987 | Nakagawa et al. . |
| 4,705,759 | 11/1987 | Lidow et al. . |
| 4,710,478 | 12/1987 | Yoder et al. . |
| 4,721,990 | 1/1998 | Kinoshita . |
| 5,338,693 | 8/1994 | Klinzer et al. . |
| 5,475,252 | 12/1995 | Merrill et al. . |
| 5,583,369 | 12/1996 | Yamazaki et al. ........................ 257/635 |
| 5,661,322 | 8/1997 | Williams et al. ........................ 257/327 |

FOREIGN PATENT DOCUMENTS

| | | |
|---|---|---|
| 57-155769 | 9/1982 | Japan . |
| 58-182246 | 10/1983 | Japan . |
| 59-171162 | 9/1984 | Japan . |
| 401291468A | 11/1989 | Japan ...................................... 257/342 |

OTHER PUBLICATIONS

Silicon processing for the VLSI ERA, V2 Stanley Wolf, 1990.

HEXFETS Databook of 1985, published by the International Rectifier Corporation of El Segundo, CA pp. B–10 through B–12.

W.R. Dawes, Jr. et al. "Transient Hardened Power FETS", presented at the Nuclear Space and Radiation Effets Conference, sponsored by IEEE, Jul. 20–24, 1986, pp. 1–7.

G.B. Roper et al. "Development of a Radiation Hard N–Channel Power MOSFET," IEEE Transactions on Nuclear Science, vol. NS–30, No. 6, (Dec. 1983) pp. 4110–4115.

A. Bindra, "Rad–Hard Power MOSFETs", Electronic Engineering Letters, (Jan. 1987).

"Unveils Rad–Hard MOSFETs", Electronic Buyers' News, Jan. 12, 1987, p. 12.

D. Tunick, "Failure Mechanisms Probed for Rad–Hard Power MOSFETs", Electronic Design (Nov. 1986).

J.L. Titus, et al., "Impact of Oxide Thickness on SEGR Failure in Vertical Power MOSFETs: Development of a Semi–Empirical Expression", submitted for publication in IEEE Trans. on Nucl. Sci. (1995).

B. Jayant Baliga, "Modern Power Devices", John Wiley & Sons, 1987, pp. 29, 314–315.

*Primary Examiner*—Tom Thomas
*Assistant Examiner*—Fetsum Abraham
*Attorney, Agent, or Firm*—Ostrolenk, Faber, Gerb & Soffen, LLP

[57] ABSTRACT

A process for producing a radiation resistant power MOSFET is disclosed. The gate oxide is formed toward the end of the processing and is not exposed to substantial thermal cycling. The gate oxide thickness is increased to more than 1250 Å for a device with a reverse voltage rating of 250 volts and the channel concentration is reduced to maintain a low threshold voltage. The thicker oxide prevents single event damage under reverse bias voltage.

3 Claims, 4 Drawing Sheets

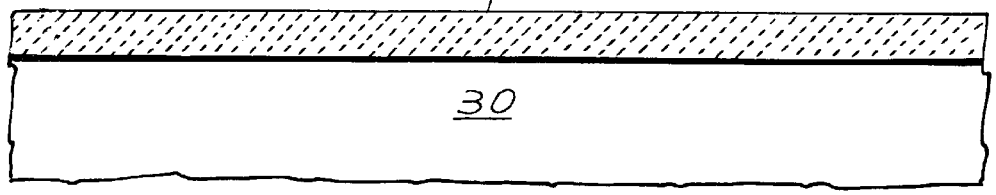
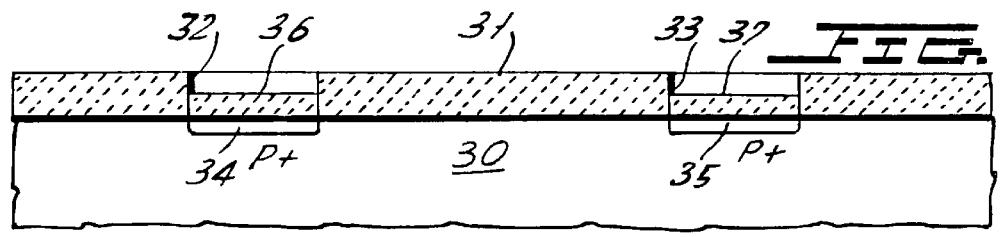
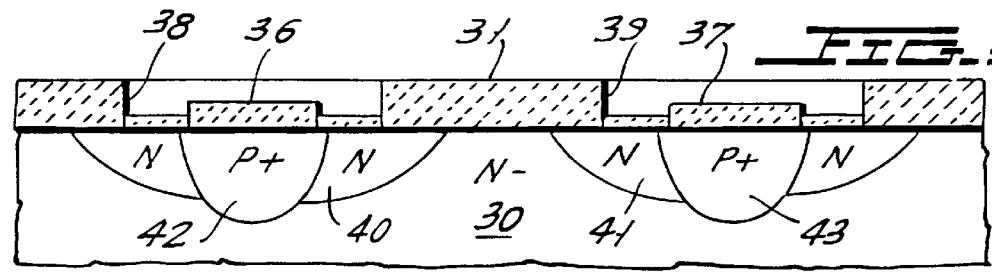
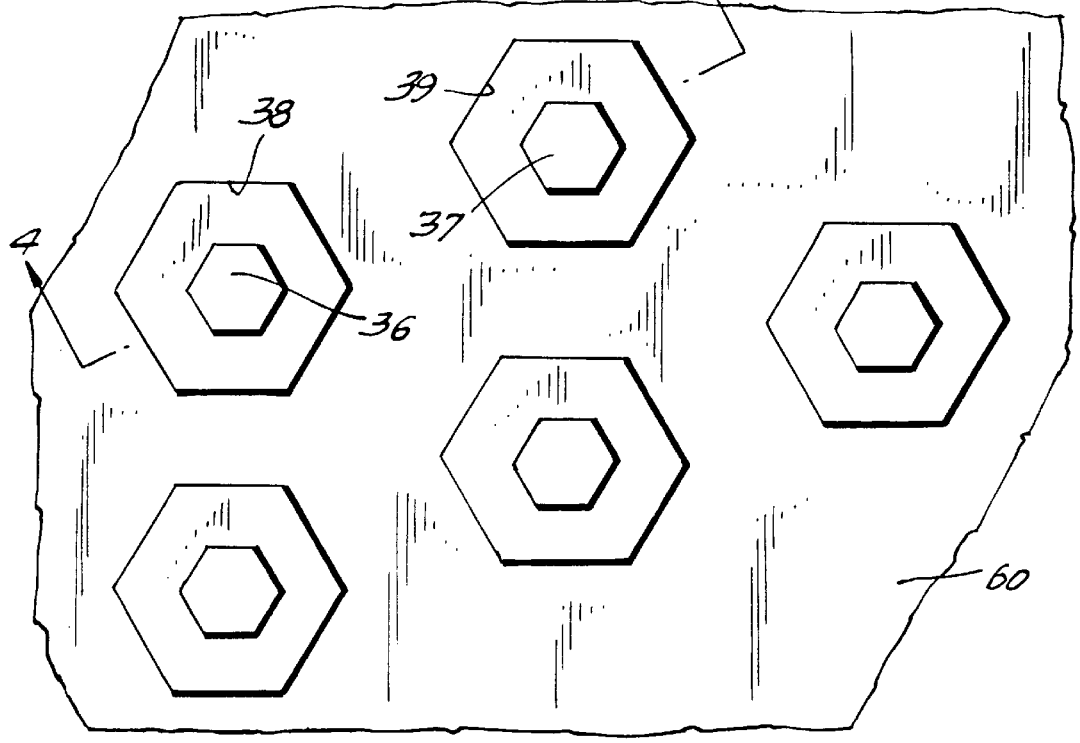

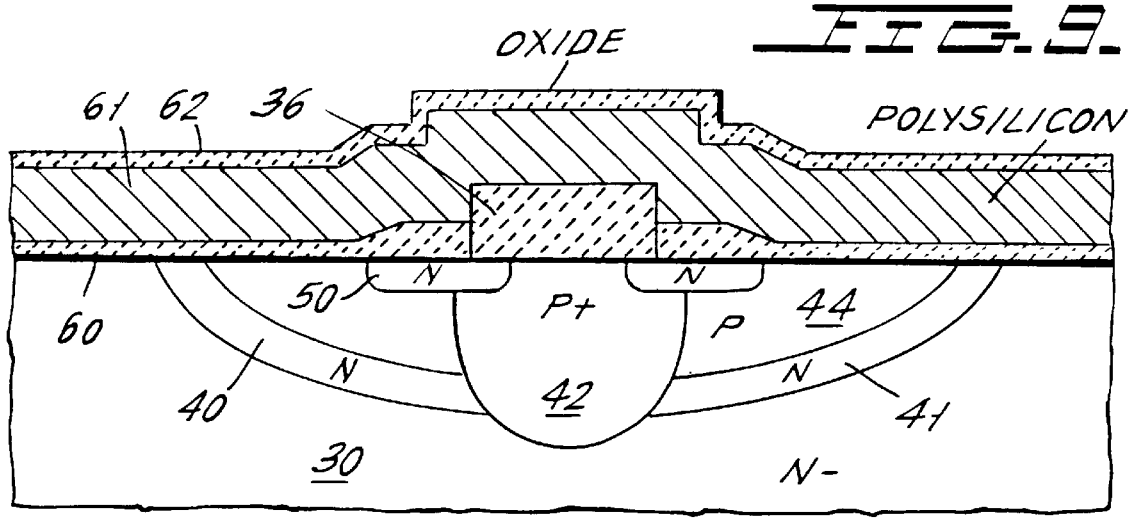
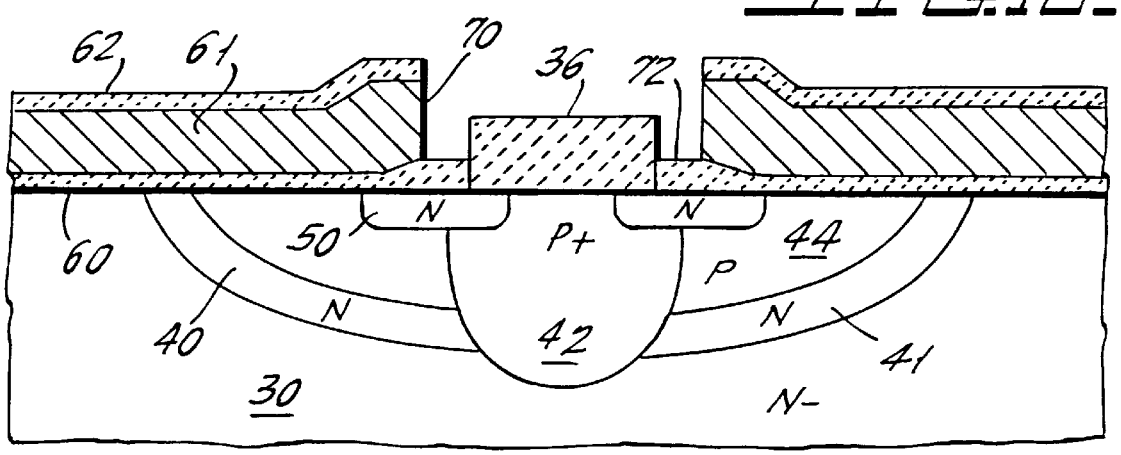
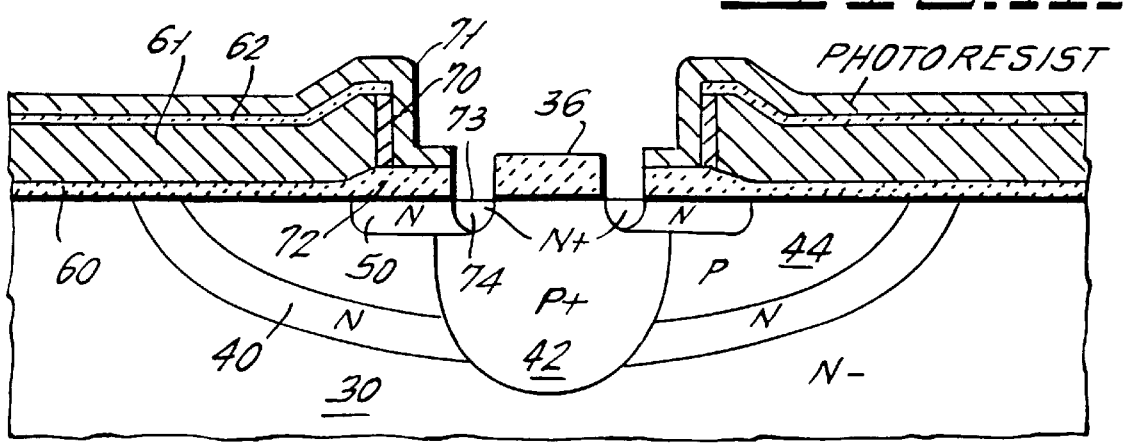

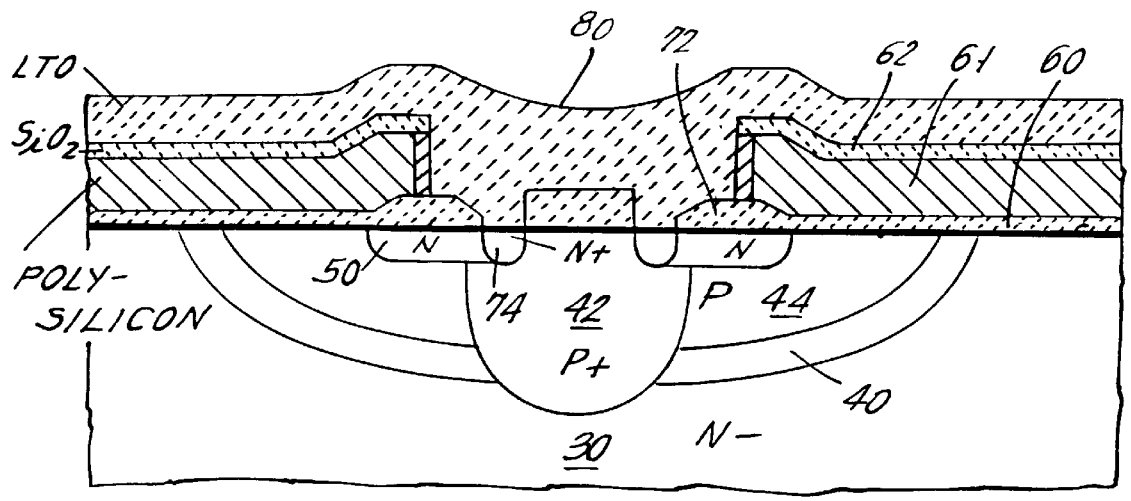
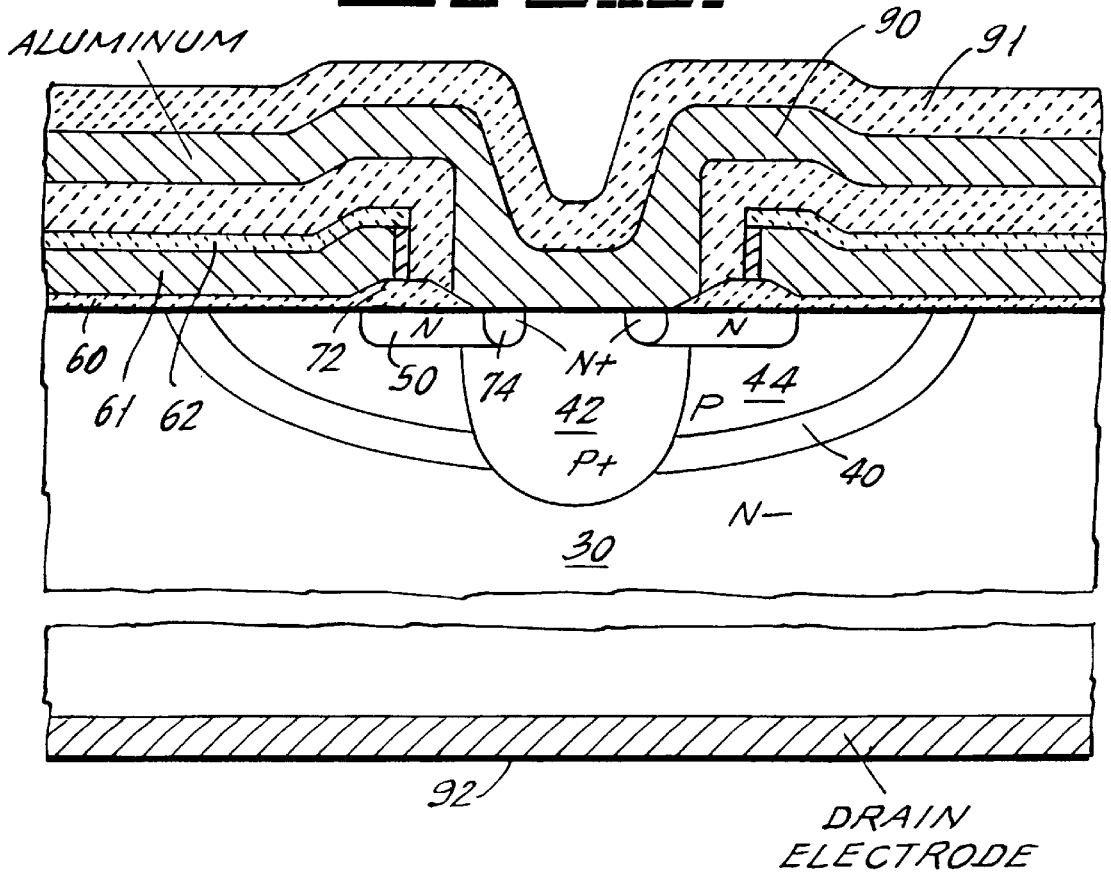

RADHARD MOSFET WITH THICK GATE OXIDE AND DEEP CHANNEL REGION

RELATED APPLICATIONS

This application is related U.S. Pat. No. 5,475,252, issued Dec. 12, 1995, in the name of Perry Merrill and Kyle A. Spring, entitled PROCESS FOR MANUFACTURE OF RADIATION RESISTANT POWER MOSFET AND RADIATION RESISTANT POWER MOSFET and assigned to the assignee of the present invention.

FIELD OF THE INVENTION

This invention relates to MOSgated power semiconductor devices, and more specifically relates to a novel radhard (radiation resistant) structure for a power MOSFET which has improved resistance to failure due to a single event particle.

BACKGROUND OF THE INVENTION

Power MOSgated devices for application in radiation-rich environments, commonly termed radhard devices, are well known. Such devices are described in U.S. Pat. No. 5,338,693 which is assigned to the assignee of the present application. The design rules for the design of such radhard devices are quite different from those of conventional MOS-gated devices, such as power MOSFETs, IGBTs, MOSgated thyristors and the like. These different design rules arise to ensure the continued operation of the MOSgated device in an ionizing radiation environment. The design rules generally call for the use of the thinnest possible gate oxide (for example, about 700 to 900 Å for a 400 volt reverse breakdown device) to minimize threshold voltage shift in the presence of a high radiation background. A process sequence is also employed which reduces the exposure of the gate oxide to high temperature process steps.

In order to control threshold voltage and because of the thin gate oxide, the channel region concentration is relatively high compared to that of an equivalent non-radhard power MOSFET, for example, a concentration less than that produced by a boron implant of a dose of about 1E13 in an N type substrate region with a background concentration produced by a phosphorus implant of about 1E12 and after a boron drive at about 1175° C. for about 120 minutes.

Radhard devices made according to the above techniques operate well in a high radiation environment, for example, of the kind experienced by MOSFETs in outer space environments and high altitude missiles or aircraft. However, it has been found that such MOSFETs are subject to failure due to a single event particle such as a single cosmic ray packet or high energy discrete particle. A single event particle of this type has been found to possibly cause the collapse of the electric field of the device under the gate oxide if the particle hits while the device is in the reverse-bias mode. This is believed to occur because of the turn on of the parasitic bipolar transistor formed by the N type source, P type base and N type drain in an N channel MOSFET. It is believed that the electric field lines collapse along the path of the single (or plural) event particle so that the low concentration drain epi which ordinarily withstands reverse voltage is "short circuited" and the full reverse voltage is applied across the gate oxide.

BRIEF SUMMARY OF THE INVENTION

Having recognized the problem as stated above, the problem can be solved by increasing the gate oxide thickness, thus increasing the ability of the device to withstand full reverse voltage in a transient fashion. Thus, the gate oxide thickness is increased from 700 Å to about 900 Å to 1200 Å to 1500 Å (about a 66% increase).

It has been found that a gate oxide thickness of from 1250 Å to 1350 Å will successfully withstand reverse voltages of from 300 volts to 600 volts, whereas a 900 Å thick oxide failed at a reverse voltage of 250 volts.

Since a thicker gate oxide is used to carry out the purposes of the invention, the concentration of the channel region beneath the gate oxide should be reduced to maintain a relatively low threshold voltage. Thus, in prior art devices, the channel concentration is formed by an implant of boron at a dose of about 1E13 to 10E13, followed by a drive at 1175° C. for about 120 minutes. When employing the oxide thickness of the invention, the boron dose is preferably reduced from about 9E12 to 9E13 with a drive at about 1175° C. for about 150 minutes.

As a further feature of the invention, the gate oxide is formed at a late step in the process and is formed after all high temperature junction diffusion steps.

BRIEF DESCRIPTION OF THE DRAWINGS

FIG. 1 is a cross-section of a chip of silicon which is to be processed in accordance with the invention and after the growth of a field oxide.

FIG. 2 shows the chip of FIG. 1 after the first mask operation and the ion implantation of a dose of boron atoms and an oxide growth after ion implantation.

FIG. 3 is a plan view of the chip of FIGS. 1 and 2 after a second mask operation in which an array of hexagonal openings are etched through the field oxide.

FIG. 4 a cross-sectional view of FIG. 3 taken across section lines 4—4 in FIG. 3 in which phosphorus atoms are ion implanted and driven to form an N type region.

FIG. 9 shows the chip of FIG. 8 after the deposition of a polysilicon layer and a thin oxide coating thereon.

FIG. 10 shows the fourth mask step for patterning the polysilicon.

FIG. 11 shows the result of an alternative process step, following the step of FIG. 7 in which an annular opening is formed around the central oxide dot and a low temperature POCl deposition forms an annular N+ ring around the central oxide dot of each cell before the gate oxide is formed.

FIG. 12 shows the chip of FIGS. 10 and 11 after the deposition of an LTO layer and reflow thereof.

FIG. 13 shows the chip of FIG. 12 after the sixth mask step in which windows are pierced in the LTO layer, an aluminum contact is deposited over the device surface, and after a surface passivation layer is formed thereon.

DETAILED DESCRIPTION OF THE DRAWINGS

Figure 5:
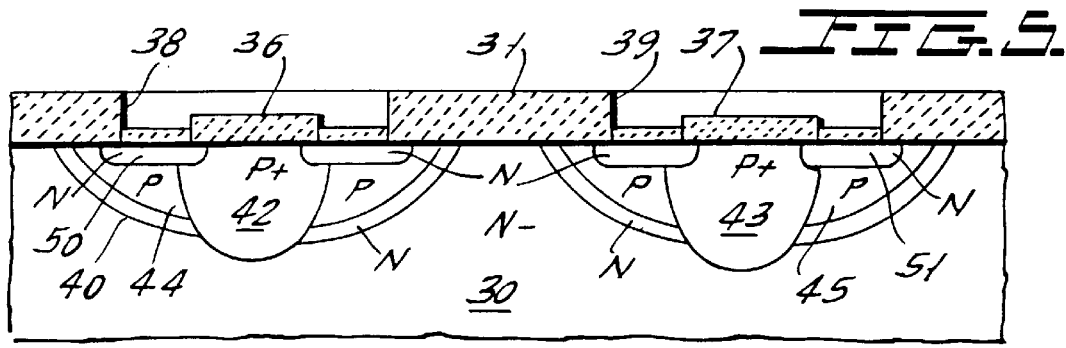
FIG. 5 shows the chip of FIG. 4 in which boron atoms were implanted and driven through the opened window to form a channel region, followed by implantation of arsenic atoms to form a source region and an anneal step.

The Figures show the manner in which an N channel MOSgated device, in particular, a MOSFET can be manufactured in accordance with the invention. It will be obvious to those skilled in the art that P channel devices can similarly be formed, making appropriate modifications in the conductivity types which are defined by the process. The process flow disclosed is similar to that described in U.S. Pat. No. 5,338,693. Other process flows can be used.

Referring first to FIG. 1, there is shown a portion of a wafer of monocrystalline silicon having an N type epitaxially deposited layer 30 thereon. In the usual fashion, a large number of identical devices will be fabricated in a common wafer which is later diced to produce individual devices which are appropriately housed. The epitaxial layer 30 may have a resistivity of 6.8–7.8 ohm/cm for the manufacture of power MOSFET device having a reverse breakdown voltage of 250 to 300 volts. A higher resistivity is used for higher voltage devices.

Before processing is begun, a sacrificial field oxide having a thickness of about 7000 Å may be first grown on the surface of layer 30 and thereafter etched away, thus ensuring a clean surface. Thereafter, the first step of the process shown in FIG. 1 is carried out, which is the formation of the field oxide 31 having a thickness of 14,000 Å. Any standard oxide growing process can be used.

Thereafter, a first mask is applied to the surface of oxide 31 and an oxide etch is carried out to cut circular openings, shown as openings 32 and 33 in FIG. 2, in the oxide layer 31. The openings 32 and 33 are spaced on centers which are spaced apart by 38 microns. These openings are arranged in a regular pattern over the full surface of the device and define the centers of each of the individual MOSFET cells which are to be formed in the device. Typically, 22,000 openings, such as openings 32 and 33, can be formed in a typical device (or die). A 5 inch wafer is later diced into about 240 individual die.

After the openings 32 and 33 have been formed, a boron ion implant step is carried out in which boron ions having an energy of 120 kv are implanted through the openings at a dose of about 7E14 ions per cm$^2$. After the implant step, the boron ions are driven at a temperature of 1050° C. for 100 minutes, thereby forming the shallow P+ regions 34 and 35 respectively in FIG. 2. At the same time, regrown oxide layers, shown as layers 36 and 37, are formed over the bottom surfaces of the openings formed by windows 32 and 33. Oxide layers or dots 36 and 37 are grown to a thickness of about 5000 Å.

Thereafter, a second masking step is carried out to form the geometry shown in FIGS. 3 and 4. More specifically, in the second masking step, hexagonal openings having a perpendicular distance between parallel flats of about 23 microns are etched in regions coaxial with the centers of the openings 32 and 33. Two such openings 38 and 39, associated with dots 36 and 37, are shown in FIGS. 3 and 4. The geometric pattern of the surface of the entire wafer is partially shown in FIG. 3. During this etching operation, the diameter of the oxide dots 36 and 37 is reduced to about 11 microns. The step carried out with the second mask shown in FIGS. 3 and 4 is not self-aligned. The step of FIGS. 3 and 4 is used to define the channel and source diffusions as will now be described.

An enhanced drain region may be first formed, as shown in FIG. 4, by a phosphorus ion implant step. Thus, phosphorus ions are implanted through the annular window formed between the periphery of windows 38 and 39 and the central dots 36 and 37, respectively. Note that a blanket implant can be used, rather than a diffusion through the annular windows. The implanting operation takes place at about 120 kv with a dose of about 1E12 ions/cm$^2$. The annular window has a radial dimension from the outer peripheral surface of dots 36 and 37 of about six microns in FIG. 4.

Thereafter, the implanted phosphorus is driven at about 1200° C. for about 100 minutes. During this drive operation, the N+ regions 40 and 41 are formed and, at the same time, the P+ regions 34 and 35 increase in depth and become the deeper regions 42 and 43 respectively.

Thereafter, and in accordance with one aspect of the invention, a boron implant is carried out in which boron atoms at an energy of 80 kv and a dose of 7.5E13 ions/cm$^2$ are implanted through the same annular windows of FIG. 4 for about 0.1 minute. These ions are then driven at a temperature of 1175° C. for about 150 minutes, thereby to define the P type channel regions 44 and 45 shown in FIG. 5.

Note that the dose is reduced from the dose of 8.5E13 to 1E14 which was used with the thinner gate oxide of the prior art.

The resulting cell structure at this stage of the manufacture is a reduced concentration P type channel region which has an outer N type shell. Note that a blanket N implant could be used in place of the N type shell. The outer N type shell will act in the manner of the increased conductivity region of U.S. Pat. No. 4,593,302 and is employed to reduce the on-resistance of the device, in part, by reducing the effect of the parasitic JFET formed by P region 44, N+ region 30 and P region 45. The increased conductivity of N type shells 40 and 41 (relative to the N+ material of body 30) reduces the efficiency of the parasitic JFET gate and prevents its pinching off or depleting the channels between the cells, which would increase the on-resistance. This region can be eliminated if the cells are more widely spaced.

After the boron implant and drive, the source regions for each cell are formed by implanting arsenic atoms through the window in FIG. 5 at an energy of 50 kv and dose of 1E14 to 5E15 ions/cm$^2$. Note that this step employs arsenic rather than the more conventional phosphorus. Arsenic is employed since it will diffuse more slowly than phosphorus. Therefore, the source regions will not unduly deepen during subsequent high temperature processing steps. The arsenic atoms define the N type source regions 50 and 51 which are annular regions surrounding the P+ regions 42 and 43.

Following this operation, an annealing step is carried out wherein the wafer is heated at about 975° C. for 20 minutes in nitrogen gas, and thereafter for 100 minutes in dry oxygen while the temperature is ramped down. It is important to note that the gate oxide still has not been applied to the device and, therefore, is not subject to any of the thermal cycling described.

Figure 6:
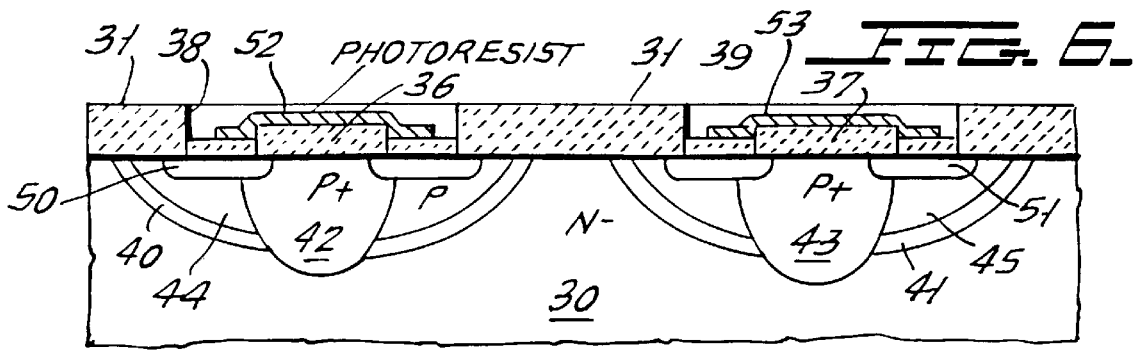
FIG. 6 shows the chip of FIG. 5 after the third mask operation which leaves a photoresist over the central oxide button of each cell.
Figure 7:
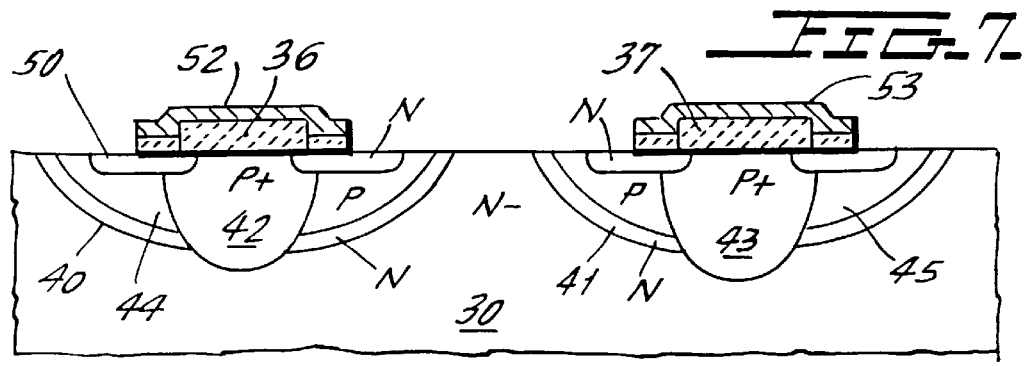
FIG. 7 shows the chip of FIG. 6 after an oxide etch step.

The wafer of FIG. 5 is then subjected to a third mask step in which the mask is provided with openings to enable the formation of a photoresist coating over the various dots 36 and 37. The photoresist coating is shown in FIGS. 6 and 7 as the photoresist coatings 52 and 53. All exposed oxide is then removed by an appropriate oxide etch as shown in FIG. 7.

Thereafter, the photoresist layers 52 and 53 are stripped and the wafer may be etched lightly in order to thin down the oxide dots 36 and 37 to a height of about 3000 Å. It will be noted that the photoresist dots which overlie dots 36 and 37 have a diameter of about 14 microns to ensure that the dots will be covered even if there is misalignment between the dot center and the center of the opening in the mask used to define the photoresist diameter.

Figure 8:
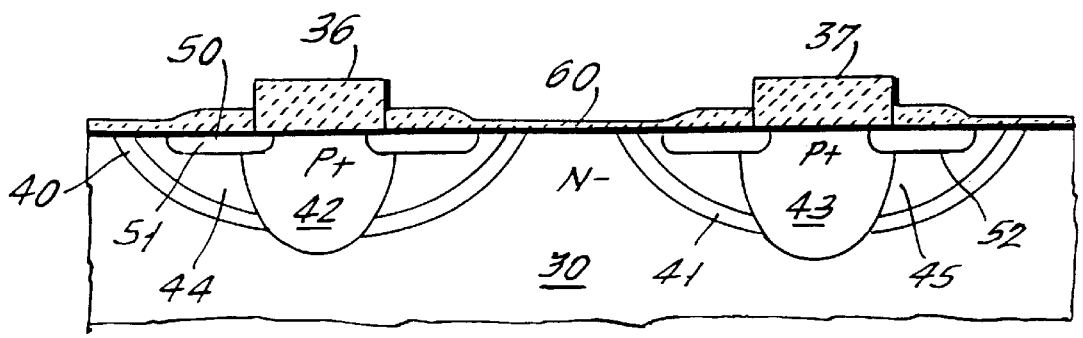
FIG. 8 shows the chip of FIG. 7 after photoresist stripping and the deposition of the thin gate oxide layer.

The wafer is then processed for the formation of the gate oxide coating. The gate oxide coating is shown in FIG. 8 as the oxide coating 60 which, in accordance with the invention, has a thickness of about 1250 to 1350 Å for a device having a reverse voltage of 250 volts to 600 volts. Note that the prior art thickness was 700–900 Å. The oxide 60 is somewhat thicker where it overlies the arsenic doped source regions because silicon oxide grows faster over arsenic rich silicon. The thinnest oxide layer possible was previously grown, since the thinner oxides will have a reduced total dose threshold shift in the presence of a radiation dose. By growing the gate oxide at the step of FIG. 8 in the manufacturing process, there is a substantial reduction of postoxidation thermal cycling at high temperature, which would make the device more sensitive to radiation. However, it has been found that thicker oxides can be used, with the added benefit of making the device resistant to single event breakdown under reverse bias. Note that the resistivity of the channel regions 44 and 45 is increased to enable channel inversion with the thicker gate oxide at the same threshold voltage.

Following the formation of the novel thickened gate oxide coating 60, and as shown in FIG. 9, a polysilicon layer 61 is formed over the device surface. Next, POCl is deposited onto the polysilicon layer. The deposition takes place at about 925° C. to heavily dope the polysilicon gate electrode layer. The polysilicon layer 61 is then covered by a very shallow oxide layer 62 which can have a thickness, for example, of about 500 Å and is used so that it can serve as a mask to pattern the polysilicon 61 in a later step.

A fourth masking step employs a mask to pattern the polysilicon to open hexagonal openings such as opening 70 in FIG. 10 at each of the cell sites. The opening 70 has a diameter from flat to flat (perpendicularly to the parallel flats of the hexagonal cell), of about 21 microns. The interior edges of the window 70 slightly overlap the thickened oxide coating 72 over the source regions 50. Consequently, the polysilicon 61 is farther removed from the surface of the silicon 30 to reduce input capacitance.

The oxide coating 72 can further be thickened at this point to further reduce input capacitance and to form a diffusion barrier. The diffusion barrier may be necessary if a POCl deposition is used to make good ohmic contact to the source electrode. The barrier thus prevents heavy doping of the source region 50 except where intended. The thickening of coating 72 is typically carried out at 900° C. in a pyrogenic steam ambient for 15–45 minutes. This also oxidizes the polysilicon sidewalls forming a conforming oxide. This improves gate reliability.

Thereafter, a fifth masking step is carried out in which a photoresist coating 71 is formed over the surface of the wafer but exposes an opening 14 mils in diameter at a position overlying the oxide coating 60 and oxide button 36. Note that the oxide button 36 in FIG. 10 is considerably greater in thickness than the increased thickness region 72 of the gate oxide coating 60 overlying the source region 50. More specifically, region 72 is about 1500 Å thick, whereas the button 36 in FIG. 10 is about 3000 Å thick.

An etching step is then carried out which, as shown in FIG. 11, reduces the height of the button 36 in about 1500 Å and forms an annular notch 73 extending down to the surface of the silicon 30. Notch 73 is defined between the remainder of button 36 and the increased thickness region 72 of the oxide layer.

After forming the notch 73, the photoresist layer 71 is stripped (shown in place in FIG. 11), and POCl is deposited over the wafer but is not driven. The deposition takes place at about 925° C. to produce a small drive which acts to create the annular N+ ring 74 around the interior of the N type, and less conductive, annular source 50. Note that the processing to form this ring 74, which is used to make good contact to the source electrode, produces no adverse thermal cycling on the gate oxide 60. Note that this N+ ring 74 could be formed before the gate oxide layer is formed.

Thereafter, an LTO layer 80 (phosphorus doped silicon dioxide) (which could be used to form the N+ ring 74) is formed over the device surface as shown in FIG. 12. The LTO layer 80 is then subjected to about 900° C. in a wet atmosphere for about one hour to obtain the desired reflow of the LTO material. This again does not adversely affect the properties of gate oxide 60. Note that the oxide region 72 is thick enough to keep the phosphorus and the LTO layer from defusing through. A thickness of greater than about 1500 Å for region 72 is sufficient for this purpose.

Thereafter, and as shown in FIG. 13, a sixth masking operation takes place in which mask openings, each about 10 microns in diameter, are located over the center of the P regions 42 to form openings for exposing the silicon for a contact deposition operation. An aluminum layer 90 is then deposited over the surface and makes contact with the P+ dots 42 and the source region 50, including its high conductivity interior annulus 74.

Thereafter, conventional steps are carried out to complete the chip structure, including an etching operation which patterns the aluminum coating 90 to define and separate the source electrode from gate bus fingers as disclosed in U.S. Pat. No. 4,593,302. A scratch coating, which is a surface passivation consisting of phosphorus doped glass having lower phosphorus concentration than LTO, is then formed as the layer 91 in FIG. 13.

Thereafter, a further masking operation is carried out to define a connection pad etch and to form the backside metal, comprising the drain electrode 92, shown in FIG. 13.

In the manufacture of the device as described above, it will be apparent that the relatively thick gate oxide 60 is not subjected to substantial thermal cycling, thereby being less sensitive to radiation damage. Indeed, the device exhibits a relatively flat curve of threshold gate-to-source voltage as a function of total radiation up to and exceeding 1 megarad. The use of arsenic for the formation of the source is extremely useful, since it provides a ballasting action, by forming a relatively high resistance source. By relatively high resistance is meant a resistance of from 50 ohms per square to 500 ohms per square. However, a good ohmic contact is made to the source because the novel N+ ring 74 contacts the source electrode.

The device, preferably, but not necessarily, is rated at less than about 300 volts, thereby making it maximally resistant to damage due to neutron irradiation. This is done by specifying the resistivity of the epitaxial layer 30 to 6.8–7.8 ohms/cm and an epitaxial thickness of about 33±3 microns, corresponding to about 300 volts breakdown voltage rating.

In forming the gate oxide 60, the gate oxide can preferably be grown in one of several ways. It can be grown at 900° C. in wet steam without anneal, and can be grown in 975° C. or 1000° C. dry oxygen with no anneal. Both of these methods are known to produce enhanced radiation hardness. Other techniques which can be used are growing the oxide layer 60 at 900° C. in wet steam followed by an anneal at 900° C. in nitrogen. Alternatively, the oxide layer can be grown at 900° C. in wet steam with a dry oxygen gas anneal at 900° C. Both of these processes can enhance radiation hardness. Also the oxide layer can be grown in 975° C. or 1000° C. dry oxygen and annealed in nitrogen or forming gas. These processes can also enhance radiation hardness.

While the contact to the source electrode has been disclosed as an ohmic contact, it is also possible to use a Schottky contact in which the relatively high resistivity source region is directly connected to the aluminum metal. This produces a very inefficient, leaky Schottky contact, which will have an increased resistance and will produce good ballasting for the numerous parallel connected source regions of a given device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOSgated device which is resistant to single event radiation failure having improved radiation resistance; said MOSgated device comprising a die of monocrystalline silicon having flat parallel upper and lower surfaces and having a body region extending from said upper surface which is of one conductivity type; a plurality of laterally spaced channel regions of the opposite conductivity type extending from said upper surface of said die and into said body region; a respective source region for each of said channel regions; said source regions being of said one conductivity type and extending from said upper surface of said die into their said respective channel regions for a depth less than the depth of their respective channel regions; a gate oxide overlying said channel regions; a gate electrode means disposed atop said gate oxide and insulated from said spaced channel regions and operable to invert said spaced channel regions in response to the application of a suitable gate voltage to said gate electrode means; a source electrode disposed atop said first surface and ohmically connected to each of said source regions; said gate oxide having a thickness which is greater than about 1250 Å for a device having a reverse breakdown voltage of greater than about 250 volts.

2. The MOSgated device of claim 1 in which said source regions are formed by arsenic impurity atoms.

3. The MOSgated device of claim 1 wherein said channel regions are formed by a boron implant at about 80 kev at a dose of about 7.5 E13 followed by a 150 minute drive in 1175° C. so that said channel regions have a reduced doping concentration.

* * * * *